United States Patent [19]
Adams et al.

[11] Patent Number: 6,163,862
[45] Date of Patent: Dec. 19, 2000

[54] ON-CHIP TEST CIRCUIT FOR EVALUATING AN ON-CHIP SIGNAL USING AN EXTERNAL TEST SIGNAL

[75] Inventors: R. Dean Adams, Hanover; Edmond S. Cooley, Lyme, both of N.H.; Patrick R. Hansen, Essex Junction, Vt.

[73] Assignee: International Business Machines Corporation, Armonk, N.Y.

[21] Appl. No.: 08/980,524

[22] Filed: Dec. 1, 1997

[51] Int. Cl.[7] .............................. G11C 29/00; G01R 31/28
[52] U.S. Cl. .......................... 714/718; 714/733; 365/201
[58] Field of Search .................................... 714/718, 719, 714/721, 733, 734, 735, 736; 365/201

[56] References Cited

U.S. PATENT DOCUMENTS

| | | | |
|---|---|---|---|
| 5,121,081 | 6/1992 | Hori | 330/279 |
| 5,166,836 | 11/1992 | Choi | 360/41 |
| 5,229,770 | 7/1993 | Nakajima | 341/161 |
| 5,535,164 | 7/1996 | Adams et al. | 365/201 |
| 5,841,786 | 11/1998 | Keyes | 714/718 |
| 5,848,016 | 12/1998 | Kwak | 365/201 |

FOREIGN PATENT DOCUMENTS

| | | | |
|---|---|---|---|
| 6-266576 | 9/1994 | Japan | G06F 11/22 |

*Primary Examiner*—Emmanuel L. Moise
*Attorney, Agent, or Firm*—William N. Hogg

[57] ABSTRACT

An on-chip test circuit for evaluating on-chip signals for a semiconductor memory chip includes an on-chip signal associated with a memory circuit on the chip; said on-chip signal having a signal characteristic to be evaluated; an input circuit for receiving an off-chip test signal; and a test circuit that compares said on-chip signal and said test signal.

20 Claims, 3 Drawing Sheets

ON-CHIP TEST CIRCUIT FOR EVALUATING AN ON-CHIP SIGNAL USING AN EXTERNAL TEST SIGNAL

BACKGROUND OF THE INVENTION

This invention relates generally to test circuits for semiconductor devices, such as memory devices, for example. More particularly, the invention relates to methods and apparatus for evaluating on-chip signals using an on-chip test circuit with an externally applied test signal.

Integrated circuit advances have been rapid in recent years. With each performance advance, testing of integrated circuits has grown more complex. Originally, semiconductor chips were tested with external testers where large complicated test equipment was employed off-chip to evaluate whether the semiconductor's on-chip operation was indeed correct. As semiconductor circuit complexity increased, the capability of external testers was insufficient to the task of testing all circuit functions. Thus followed the development of self-test circuits which aid the external testers in evaluating the proper operation of the on-chip circuitry. These self-test circuits were incorporated on-chip and were used to evaluate the other on-chip circuits which heretofore were not testable by external equipment or at least only with difficulty. Eventually, whole families of built-in self test (BIST) circuits were designed to allow more and more of the test function to be incorporated onto the chip, thereby allowing the external testers to be simpler in nature. Even though the external testers were simpler in nature, due to the addition of on-chip test circuits, the quality of tests and thus the quality of the final chips improved.

Prominent in their ability to be tested by such BIST circuits are semiconductor memory circuits. This includes either stand alone memories such as a memory on a chip whose function was to be a memory, or a memory embedded on a microprocessor or other semiconductor device, such as a chip circuit whose intended function was to be a microprocessor or some other logic function, yet had one or more memories on the chip to enhance the performance and operation of the logic. An example of a BIST circuit for semiconductor memory devices is given in U.S. Pat. No. 5,535,164 issued on Jul. 9, 1996 to Adams et al., entitled "BIST TESTER FOR MULTIPLE MEMORIES," the entire disclosure of which is fully incorporated herein by reference.

With improved memory design came an improvement of memory performance and thus a decrease in memory access and cycle times. The decreases in such times triggered the use of even more aggressive techniques to further improve device performance. Analog circuit techniques were a significant part of the methods used to improve performance. Analog circuits operate differently from digital circuits, the latter being of the type wherein signal values are processed as either a "1" or "0". With analog circuits there are an infinite number of values between the corresponding digital "1" and "0" values. For example, a static random access memory sense amplifier receives an analog signal from a memory cell and amplifies the analog signal sampled at a point in time and converts the amplified signal to a digital "1" or "0". Standard test techniques previously employed for digital circuits were insufficient to fully test analog circuits and signals.

A problem which memory circuit designers encounter is determining the amplitude of the analog signal feeding the sense amplifier at the time the signal is sampled. Prior attempts to measure such signals typically used external signal probes. As circuit impedance, e.g. capacitance, decreases, however, it becomes significantly more difficult to evaluate on-chip signals using conventional techniques such as external probes. This difficulty arises because the probe impedance can adversely affect the signal being measured. Accordingly, there is a need for a technique to evaluate on-chip signals, such as analog signals, without disturbing the signal being evaluated.

SUMMARY OF THE INVENTION

According to one embodiment of the present invention, a semiconductor chip includes an on-chip signal; the on-chip signal having a signal characteristic to be evaluated; and a test circuit that receives an off-chip test signal and that compares the on-chip signal and the test signal to evaluate the signal characteristic.

The invention also contemplates the methods embodied in the use of the above apparatus, as well as in another embodiment, a method for evaluating an on-chip signal for a semiconductor chip, the method including the steps of:

a) applying an externally generated test signal to one input of a test circuit on the chip;

b) applying the on-chip signal being evaluated to another input of the test circuit;

c) comparing the on-chip signal with the test signal; and d) producing an output from the test circuit that corresponds to a characteristic of the on-chip signal.

These and other aspects of the present invention will be readily understood and appreciated by those skilled in the art from the following detailed description of the preferred embodiments with the best mode contemplated for practicing the invention in view of the accompanying drawings.

DESCRIPTION OF THE PREFERRED EMBODIMENT(s)

The preferred embodiments are described in the environment of a static random access memory (SRAM) device, which is but one example of a semiconductor device that can be used with the present invention. The present invention is directed to techniques for evaluating on-chip signals without the need to load the chip using an external test device such as a test probe. The external function utilized in some of the described embodiments of the invention is the application of an external test signal as an input to a test circuit on the chip. Such an input signal does not load the memory device and also does not adversely affect the signal being evaluated.

Figure 1:
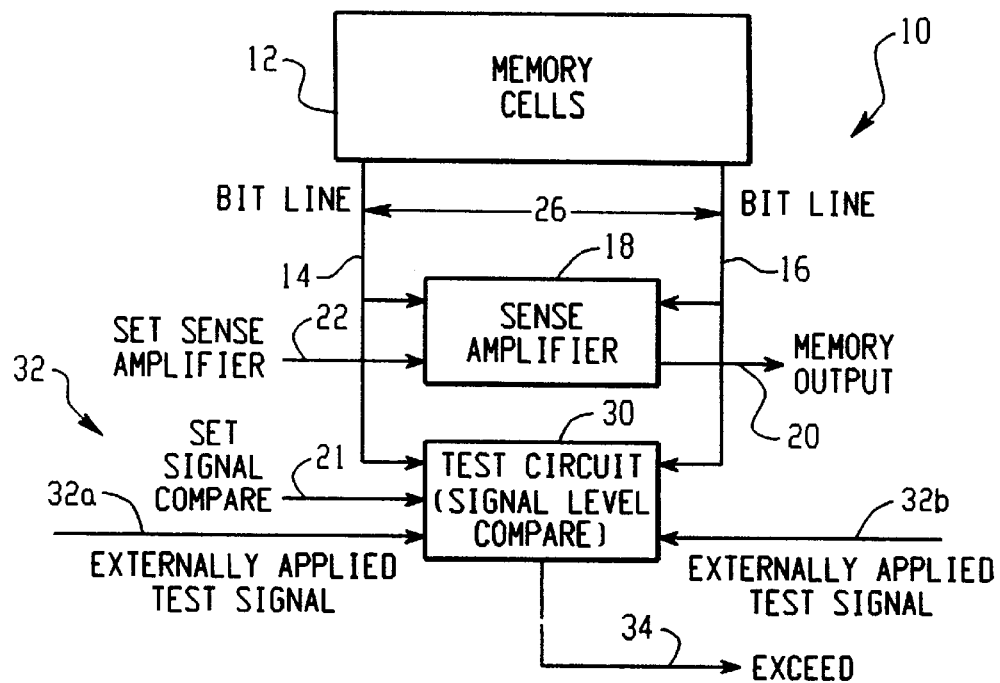
FIG. 1 is a functional block diagram of a sense portion of a semiconductor memory device that has been modified with one embodiment of the present invention.
Figure 3:
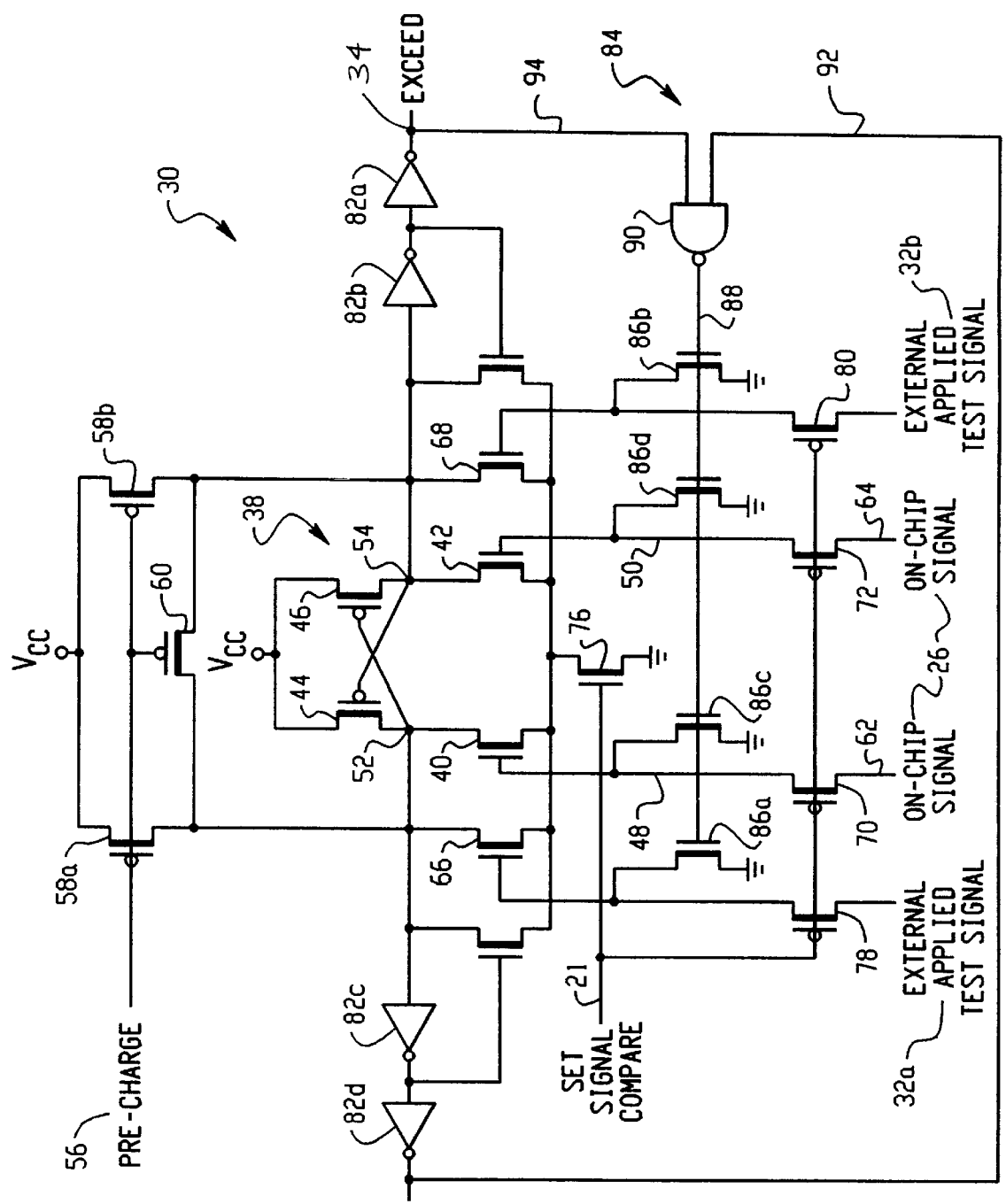
FIG. 3 is a schematic diagram of an on-chip test circuit in accordance with the invention.

With reference to FIG. 1, a semiconductor device 10, such as, for example, a static random access memory, includes a memory cell array 12. The terms "semiconductor device" and "SRAM" are used interchangeably herein for the device identified with the numeral 10 in the drawings. Those skilled in the art will appreciate that other types of devices besides SRAMs and memory devices can be used with the present invention. It is noted that the circuitry illustrated in FIGS. 1 and 3 is disposed on the semiconductor chip. The cell array 12 typically includes a substantial number of memory cells arranged in rows and columns. As is known, each cell is addressed using the appropriate row and column address signals along with row and column address decoder circuits (not shown). Each cell in a column of cells, in this example, is connected to a pair of bit lines 14, 16. Each bit line is connected through appropriate circuitry to a corresponding input of a differential sense amplifier 18 for data READ operations.

The differential sense amplifier 18 can be conventional in design and is used to detect and amplify an on-chip signal 26 that is transferred from a memory cell connected to the respective bit lines 14, 16. This on-chip signal 26 in this example is a small differential signal that is differentially presented to the sense amplifier 18 via the bit lines 14, 16, and typically corresponds to the amount of charge transferred from the memory cell. This process is generally referred to as a READ operation. The sense amplifier 18 detects the on-chip signal 26 as a small voltage disturbance on the bit lines.

Figure 1A:
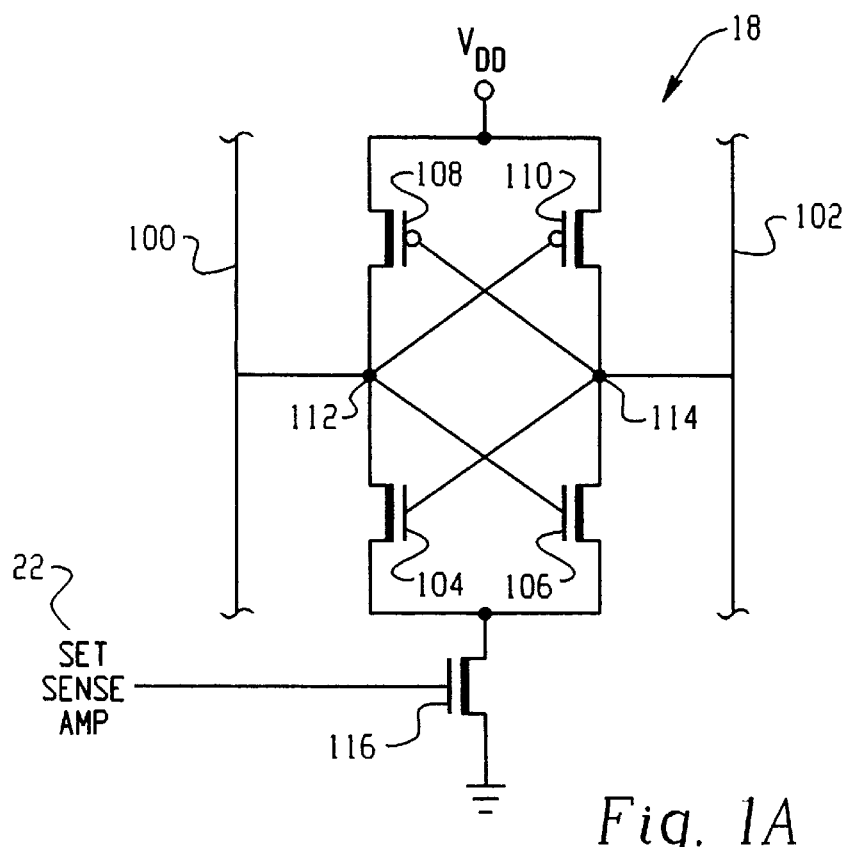
FIG. 1A is a simplified schematic diagram of a sense amplifier used to read memory cell signals.

FIG. 1A illustrates a simplified schematic diagram of a conventional sense amplifier circuit 18 suitable for use with the present invention. This circuit is well known to those skilled in the art, and a detailed description of its operation is not required. As will be explained hereinafter, an alternative design for a sense amplifier that is also suitable for the sense amplifier 18 is provided in FIG. 3.

In FIG. 1A, the bit lines 14, 16 (FIG. 1) are coupled to respective sense lines 100, 102 by suitable circuitry (not shown). The sense amplifier 18 includes a pair of n-channel sense transistors 104, 106 and a pair of p-channel load transistors 108, 110 interconnected in the familiar cross-coupled arrangement as shown. The sense amplifier 18 thus has two complementary output nodes 112, 114 (TRUE and COMPLEMENT). These output nodes 112, 114 are coupled to the device 10 output circuits (not shown) to permit the memory cell data to be detected and then output as memory data out 20 (FIG. 1) as required. A control switch transistor 116 is used to control or enable operation of the sense amplifier 18 by operation of a control input signal SET SENSE AMP 22. When the SET SENSE AMP signal 22 is active (in this case, active high), a ground reference is provided to the sense amp 18 sense transistors 104, 106.

Figure 2:
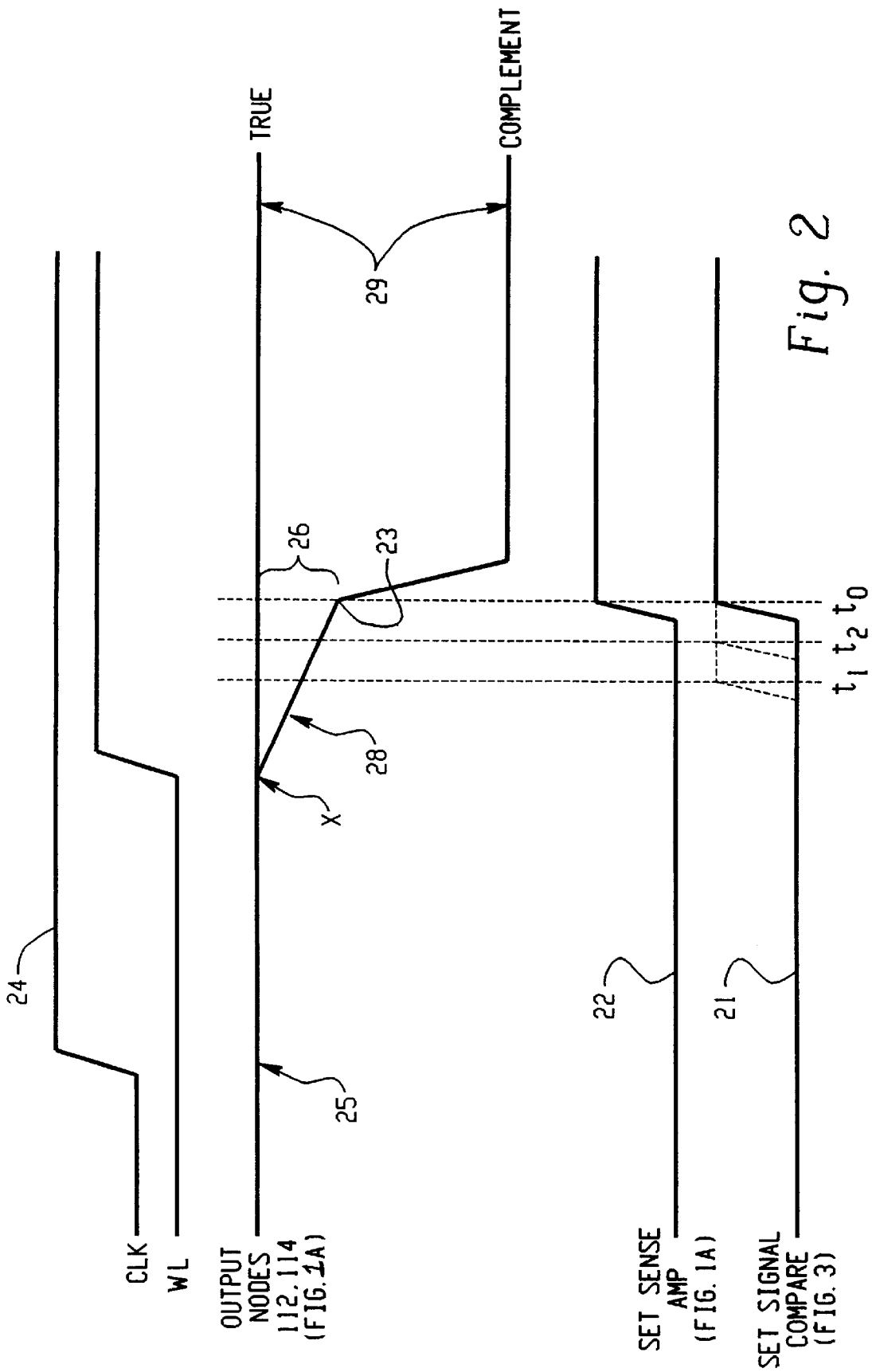
FIG. 2 is a simplified timing diagram (time on the horizontal axis, relative signal level on the vertical axis) of a typical READ operation for a memory device such as is illustrated in FIG. 1, and including a SET SIGNAL COMPARE signal in accordance with the invention.

FIG. 2 illustrates in a general way a typical timing sequence for a memory cell READ operation (FIG. 2 also includes a timing signal SET SIGNAL COMPARE that is used in the present invention as will be described hereinafter). A clock signal 24 activates a series of events within the SRAM 10. Although the embodiment herein relates to a synchronous SRAM, the present invention can also be used with asynchronous SRAMs, and more generally with any semiconductor device having an on-chip signal to be evaluated.

The sense amplifier 18 output nodes (112, 114 in FIG. 1A) are precharged to an initial condition 25. In this example, the sense amplifier output nodes 112, 114 are precharged high such as to the positive voltage rail $V_{DD}$ of the semiconductor device 10 (FIG. 3 illustrates an exemplary precharge circuit). The simplified illustration of the output nodes signal in FIG. 2 represents the sense amplifier's 18 response to the on-chip signal 26, in this case the differential signal on the bit lines 14, 16 that is received from a selected memory cell in the array 12. At time X a selected memory cell is connected to the bit lines 14, 16 by operation of its corresponding word line signal WL going high, and a differential signal 26 from the selected memory cell is developed across the bit lines 14, 16 during a transition period 28. When the SET SENSE AMP signal 22 is active such as at time $t_0$ (thus enabling the sense amp 18), the differential on-chip signal 26 is amplified by the sense amplifier 18.

The SET SENSE AMPLIFIER signal 22 (also referred to herein as the SET SENSE AMP signal) transitions to its active state at time $t_0$, where $t_0$ is a period of time (for example, about 1 nanosecond) after the word line signal WL transitions to active. When the SET SENSE AMP signal 22 goes active, the sense amplifier 18 rapidly operates to a latched condition with one output node high and the other low, as at 29 on FIG. 2. Thus, as illustrated in FIG. 2, there is a distinctive knee 23 in the curve for the output node signals because the sense amplifier 18 is rapidly driven to a latched state. When the sense amplifier 18 latches, one of the output nodes 112, 114 is pulled high and the other output node is pulled low by operation of the sense amplifier 18 cross-coupled driver design; which node is latched high and which is latched low depends on whether the memory cell was storing a "1" or a "0". The voltages at the output nodes 112, 114 of the sense amplifier 18 are thus in TRUE and COMPLEMENT form and are then further processed by output circuits (not shown) of the device 10 to produce data output signals 20 (FIG. 1) to indicate the data from the memory cell that was read.

Thus, during a READ operation, a memory cell is momentarily connected to the bit lines when the word line signal WL goes active. A charge from the memory cell is impressed on the bit lines 14, 16 and produces a small voltage differential between the bit lines. The sense amplifier 18 rapidly amplifies this differential signal and Latches so as to produce a logic "1" or logic "0" at its output 20 depending on whether a 1 or a 0 was read from the memory cell.

Due to very small capacitance associated with state of the art memory arrays, it is very difficult to externally test/ evaluate the characteristics of the data signal transferred from the memory cell. A probes applied, for example, to the bit lines 14, 16 or sense nodes 112, 114 will adversely affect or disturb the small signal being measured. This is but one example of many types of on-chip signals, in this case an analog signal, that has a signal characteristic that can be determined or evaluated using the teachings of the present invention. In this embodiment, the signal characteristic being evaluated is amplitude of the differential data signal.

With reference to FIG. 1, and in accordance with one aspect of the invention, a test circuit 30 is provided on-chip for evaluating a signal characteristic of an on-chip signal 26, such as, for example, the analog signal transferred from the memory cells in the array 12. The invention can be used, however, to evaluate any on-chip signal on any semiconductor chip. Of particular interest in the present embodiment is an evaluation of the signal strength characteristic of the memory cell signals, such as the differential voltage level that appears across the bit lines 14, 16. Thus, in the described embodiment the test circuit 30 is also referred to as a "signal level compare" circuit 30.

In accordance with this aspect of the invention, the on-chip signal 26, in this case the differential signal that appears on the bit lines 14, 16 when a memory cell is accessed and connected to the bit lines, can be evaluated by a signal voltage level comparison of the on-chip signal 26 and a test signal 32 that is applied to the chip from an external source (not shown). By changing the test signal voltage level in a series of steps or iterations, a comparator or other suitable test circuit can be used to evaluate the signal characteristic of interest. Furthermore, by varying in a controlled manner or series of iterative time steps the point at which the test signal comparison is made, a representative data set can be obtained that corresponds to the waveform over time of the on-chip signal 26.

In the embodiment of FIGS. 1 and 3, the on-chip signal 26 being evaluated is a differential signal, such as the output signal from the memory cells in the array 12. Accordingly, the test circuit 30 receives inputs from the respective bit lines 14, 16 (identified as on-chip signal lines 62, 64 in FIG. 3). The test signal 32 is also a differential signal 32a and 32b that appears across a pair of input lines to the test circuit 30. The test circuit 30 operates to compare the test signal 32 with the on-chip signal 26 and to produce an output 34. In this embodiment, the test circuit 30 functions in a manner similar to a voltage comparator, and switches the output state 34 depending on the relative magnitude of the on-chip and test signals that are input to the test circuit 30.

The present invention is not limited, however, to evaluating differential signals, such as the signals from the memory cells. The invention can also be applied to evaluating single ended signals, such as any analog signal on-chip that is relative to a reference such as ground.

With reference then to FIG. 3, an embodiment of a test circuit 30 suitable for use with the invention is shown in detailed schematic form in a manner in which the invention can be used with a semiconductor memory device 10. In this embodiment, the test circuit 30 is realized in the form of a sense amplifier circuit 38. The sense amplifier 38 design is different from the conventional sense amplifier 18 design of FIG. 1A. The sense amplifier 38 of FIG. 3 can conveniently be used, however, for the sense amplifier 18 used on the memory chip, or can alternatively be a separate stand alone sense amplifier 38 coupled to a pair of bit lines on the memory chip, or other source of an on-chip signal to be evaluated.

In FIG. 3, the sense amplifier 38 fundamentally includes a pair of sense transistors 40 and 42 with respective load drive transistors 44, 46. Each sense transistor 40, 42 has a respective gate node coupled to a respective sense line 48, 50. The drain node of each load transistor 44, 46 is connected to the drain node of its respective sense transistor 40, 42, and further is cross-coupled to the gate node of the opposite load transistor. Operation of the cross-coupled transistor pairs is as follows. With well matched transistor characteristics, the basic sense amplifier 38 operates as a differential amplifier that latches or stabilizes with one of the sense transistors 40, 42 turned on harder than the complementary sense transistor based on a differential signal that appears initially at the respective sense lines 48, 50. The sense amplifier 38 has complementary output nodes 52, 54 which are driven, by operation of the cross-coupled load transistors 44, 46, to complementary "1" and "0" logic states based on the differential signal detected across the sense lines 48, 50. Note that in contrast to the sense amplifier 18 design, the output nodes 52, 54 are not coupled to the sense lines 48, 50.

For example, assume as an initial condition that the output nodes 52, 54 are precharged to a common voltage level such as $V_{DD}$ volts. When a differential signal is impressed across the sense lines 48, 50 one of the sense transistors 40, 42 will tend to turn on harder than the complementary other sense transistor. The sense transistor that turns on harder will function as a driver to its respective cross-coupled load transistor to turn that load transistor on, having the effect of driving the other sense transistor to a rear off state. This function rapidly accelerates due to the cross-coupled arrangement of the load transistors 44,46, so that one load transistor 44, 46 fully turns on and the other load transistor turns off. For example, if a differential signal is such that the potential or charge on the sense line 48 is slightly higher relative to the opposite sense line 50, the sense transistor 40 will be driven on harder than the opposite sense transistor 42. This has the effect of turning on the load transistor 46 and turning off the load transistor 44. Since the nodes 52, 54 were initially precharged high, the on state of the load transistor 46 maintains the node 54 at a high voltage state. With the opposite load transistor 44 off, the sense transistor 40 easily pulls the output node 52 low. The sense amplifier 38 is quickly driven to a latched active quiescent state in which the first sense transistor 40 is on, producing essentially zero volts or a logic "0" at the first output node 52, while the complementary sense transistor 42 is on to a lesser degree than transistor 40, producing a positive voltage or Logic "1" at the second output node 54. If the differential signal on the sense lines 48, 50 is reversed in polarity, the sense amplifier 38 operates in a reverse manner and sets to an opposite state with the first output node 52 at a logic "1" and the second output node at a logic "0".

An exemplary precharge circuit is provided. A precharge control signal 56 is used to activate two precharge transistors 58a and 58b, which turn on in response to the precharge signal 56 and set the output nodes 52, 54 at a precharge voltage, in this example approximately the positive rail $V_{DD}$. A precharge equalization transistor 60 can be used if required.

In the exemplary embodiment of FIG. 3, an on-chip differential signal 26 to be evaluated is the differential analog signal transferred from one of the memory cells in the array 12 (FIG. 1). The same test circuit 30 can be used to evaluate the on-chip signal from each of the memory cells that share the same bit lines 14, 16 that provide the on-chip signal input to the sense amplifier 38. The differential signal 26 is input to the sense amplifier test circuit 38 by coupling the sense lines 48, 50 to respective ones of the hit lines 62, 64 as shown (using the control transistors 70, 72). As an alternative to a differential signal, a single ended signal could be evaluated by applying it to one side of the sense amplifier 38 with the other side of the sense amplifier receiving a test signal input. Other comparator type circuits could also be used in place of a sense amplifier. A sense amplifier is preferred for memory devices as they are already present on the chip and are well understood and reliable in operation.

In order to evaluate the differential on-chip signal of interest, for example, to determine its voltage amplitude, a test or reference signal is also needed. In accordance with another aspect of the invention, an external test signal 32 is also input to the sense amplifier 38 test circuit. Since the test signal 32 is differential, it is designated with the references 32a and 32b in FIGS. 1 and 3. Application of the test signal 32 for comparison with the on-chip test signal 26 is realized in the embodiment of FIG. 3 by the use of a second pair of sense transistors 66 and 68. The second pair of sense transistors 66, 68 function as test signal sense transistors and are preferably arranged in parallel respectively with the first pair of sense transistors 40, 42. In this manner, a differential test signal applied to the gates of the second pair 66, 68 will influence operation of the sense amplifier 38 in a manner similar to the differential on-chip signal 26 being evaluated.

Essentially the sense amplifier circuit 38 will function as a comparator for differential input signals, in that the amplifier 38 will settle to a quiescent state of a logical "1" or "0" at the output node 54 based on whether the differential on-chip signal 26 on the sense lines 48, 50 (applied to the sense transistors 40, 42) is greater than or less than the differential test signal 32a, 32b that is applied to the second pair of sense transistors 66, 68.

In order to control a test operation, a first pair of on-chip signal input control P-channel transistors 70, 72 are provided to connect the respective bit lines 62, 64 to the sense amplifier 38 sense lines 48, 50 in response to a SET SIGNAL COMPARE control signal 21. The input control transistors 70, 72 thus function as an on-chip signal 26 input control circuit. The SET SIGNAL COMPARE control signal 21 also activates an N-channel switch transistor 76 which provides ground reference for the sense transistors 40, 42, 66 and 68; thus in this embodiment the SET SIGNAL COMPARE signal 21 functions as an enable signal to activate the sense amplifier 38 operation. A second pair of input control P-channel transistors 78, 80 are provided to control input of the external test signal 32 to the test signal sense transistors 66, 68. The test signal input control transistors 78, 80 also operate in response to the SET SIGNAL COMPARE control signal 21.

In operation, the sense amplifier output nodes 52, 54 are first precharged to a predetermined level. The SET SIGNAL COMPARE signal 21 when low activates the control transistors 70, 72, 78 and 80, thus causing the external test signal 32 and the on-chip test signal 26 to appear at the respective sense transistors 66, 68 and 40, 42. When the SET SIGNAL COMPARE signal 21 is high, the on-chip and test signals inputs are disconnected from the sense amp 33 and the sense amplifier 38 is enabled by turning on the control transistor switch 76. The sense amplifier 38 then detects the relative magnitude of the test and on-chip signals as described herein before.

The external test signal 32 can be provided to the chip by any convenient arrangement, such as a test probe or lead. For example, the test signal can be input through one of the external package leads used for the semiconductor device 10; the use of one of the standard leads could be time multiplexed with the test function, or alternatively a separate lead dedicated for the test function could be provided.

If the on-chip signal 26 is less than the test signal 32, the output node 54 is driven to a logic "0" condition; and if the on-chip signal exceeds the test signal 32, the output node 54 is driven to a logic "1" condition. The complementary node 52 could also be used as an output if desired.

The external test signal 32 can be generated by any suitable circuit off-chip. If a specific resolution is desired for evaluating the on-chip signal, a time variable test signal can be applied to the test circuit 30. For example, the test signal 32 could be incrementally changed in a step-wise or iterative fashion until the output node 54 is observed to change state. This observation could be made visually by a test apparatus such as an oscilloscope, or electronically by a circuit that monitors the output node 54 voltage. In either case, when the output node 54 changes state, the magnitude of the on-chip signal is known based on the value of the applied test signal 32 when the transition occurred, within an accuracy or resolution of the magnitude of the incremental step applied to the test signal from the last step that did not produce a state change at the output node 54.

One technique for applying the test signal in an iterative fashion is as follows. A first magnitude, such as a minimum value, of the test signal is applied and the output node 54 state is noted. The amplitude of the test signal is then changed to a substantially higher value until the output state 54 changes state. Then a lower magnitude that is higher than the initial minimum magnitude is applied for the test signal 32 to begin narrowing the window for evaluating the actual magnitude of the on-chip signal 26. By alternating between high and low values in such a ping-pong manner, the actual value of the on-chip signal can be determined to a degree of resolution that is a function of the size of the last incremental steps. As another example, a time variant ramp signal could be applied as the test signal 32. A simple latch circuit could be used to detect the test signal value at which the output node 54 switches state. This latter technique, however, could involve more test time than the alternating technique.

The graph of the SET SIGNAL COMPARE signal 21 in FIG. 2 illustrates another aspect of the present invention. In the embodiment described thus far herein, the SET SIGNAL COMPARE signal 21 is activated at the same point in time for each iterative step of the test signal amplitude variation. In this way, the magnitude of the on-chip signal 26 is determined at a specific point in time, e.g. $t_0$ in FIG. 2. However, if in addition to varying the amplitude of the test signal 32, the SET SIGNAL COMPARE control signal 21 is activated at different points in time, then the waveform over time of the on-chip signal 26 can be evaluated. This is illustrated in FIG. 2 by the dashed lines for the SET SIGNAL COMPARE signal 21. In addition to performing the comparison of the test signal 32 and the on-chip signal 26 at time $t_0$, the same iterative process of changing the test signal 32 amplitude can also be performed at times $t_1$, $t_2$ and at any other time instant of interest. The test circuit 30 will thus evaluate the on-chip signal 26 at different points in time following activation of the word line, thus providing an evaluation of the time based waveform of the on-chip signal.

If a waveform evaluation of the on-chip signal is not required, then the SET SIGNAL COMPARE signal 21 can be, but need not be, activated coincident with the SET SENSE AMP signal 22 (as by tying the two signals together, for example), which in effect means that the test circuit 30 evaluates the on-chip signal 26 at the same point in time at which the sense amplifier 18 amplifies the memory cell signal, as at the knee 23 of the output node curve in FIG. 2.

In the embodiment of FIGS. 1 and 3, the SET SIGNAL COMPARE signal 21 is a separately controlled signal from the SET SENSE AMP signal 22. For applications in which the test circuit 30 sense amplifier 38 is also used for the sense amplifier 18 for the memory cell READ operations, then the SET SENSE AMP signal 22 and the SET SIGNAL COMPARE 21 signals will be the same signal (e.g. signal 21 line could be connected to the signal 22 line) and the on-chip signal 26 can be evaluated at a specific point in time $t_0$.

The exemplary circuit of FIG. 3 also provides output node buffers 82a, 82b, 82c and 82d if desired. Also provided is a logic circuit 84 that can be used, for example, to reduce power consumption by the test circuit 30 when it is idle.

The logic 84 includes four transistors 86a, 86b, 86c and 86d, each of which is used to connect ground or reference potential to a respective one of the sense transistor inputs 66, 68, 40 and 42. These inputs are grounded whenever the sense amplifier 38 is in a quiescent active state (i.e. a sense operation has been completed, as distinguished from a quiescent precharge state). The transistors 86a–d are controlled by a reset control signal 88 from a logic gate 90. The NAND logic gate 90 receives its inputs from both output states of the sense amplifier output nodes 52, 54, such as along signal lines 92, 94 which are connected to the outputs of the buffers 82d and 82a respectively. Thus, when the sense amplifier 38 is in an idle condition before precharge, one of the inputs to the logic gate 90 will necessarily be a logic "0" and cause the gate 90 to produce a logic "1" output. The "1" output from the logic gate 90 turns all the control transistors 86a–d on, thus grounding the sense amplifier 38 inputs, which forces all the sense transistors to be off. When the sense amplifier 38 is precharged high, on the other hand, the inputs to the gate 90 will be the same, and the logic transistors 86a–d will be off, thus permitting the on-chip signal and test (signal 32 to be input to the sense amplifier 38. The sense amplifier 38 will then operate in response to the applied test and on-chip signal when the SET SIGNAL COMPARE signal 21 is active high.

It is also contemplated that the test signal 32 could be generated on-chip for a fully integrated self-test function. In such a case, if the accuracy of the on-chip test signal is in question or needs to be normalized, the test signal could be externally evaluated by probing the test signal for its characteristics without adversely affecting the test circuit operation, because the test signal source likely would not have the same impedance limitations as are encountered when probing the bit lines.

The invention thus provides a test circuit and method for evaluating signal characteristics of on-chip signals, such as, for example, analog signals from cells in a memory array, using an externally generated test signal, without having to probe or otherwise disturb the on-chip signal being evaluated. The techniques of the invention apply to both differential on-chip signals and single ended on-chip signals, and can be used to obtain time waveform characteristics and single point in time evaluations.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions maybe implemented without departing from the true spirit of the invention as hereinafter claimed.

What is claimed is:

1. A semiconductor chip comprising: an on-chip signal; said on-chip signal having an analog voltage to be evaluated; and a test circuit that receives an off-chip test signal having an analog voltage and detects the relative magnitude of said analog voltage of said on-chip signal and said analog voltage of said test signal to evaluate the voltage level of the on-chip signal.

2. The chip of claim 1 comprising a memory circuit.

3. The chip of claim 2 wherein said test circuit comprises a sense amplifier.

4. The chip of claim 1 comprising input control logic to reduce power consumption when said test circuit is idle.

5. The chip of claim 1 wherein said on-chip signal comprises a single ended signal.

6. The chip of claim 1 wherein said on-chip signal comprises a differential signal.

7. The chip of claim 6 wherein said differential signal is input to a differential sense amplifier.

8. The chip of claim 7 wherein said differential sense amplifier comprises a first pair of sense transistors; and said differential signal is applied to said first pair of sense transistors.

9. The chip of claim 8 comprising a second pair of sense transistors, each of said second pair sense transistors being in parallel with a respective one of said first pair of sense transistors; said test signal comprising a differential test signal and being applied to said second pair of sense transistors; said sense amplifier producing an output that indicates said on-chip signal exceeds said test signal.

10. The chip of claim 8 wherein said differential sense amplifier is connected to a pair of bit lines of a memory array.

11. The chip of claim 10 wherein said sense amplifier operates to READ data for memory cell connectable to said bit lines.

12. The chip of claim 1 wherein said test signal is applied iteratively to vary with each iterative step a characteristic of said test signal; said test circuit producing in response to said test signal an output that indicates said signal characteristic based on each iterative step.

13. The chip of claim 12 wherein said test circuit comprises a sense amplifier connected to a pair of bit lines of a memory array on the chip; said on-chip signal comprising a differential input signal on said bit lines; said test signal being applied as a test voltage that varies with time in a predetermined manner such that said sense amplifier output state indicates said on-chip signal being greater than said test signal.

14. The chip of claim 1 wherein said test circuit operates to evaluate said signal characteristic at different points in time to thereby evaluate an on-chip signal waveform.

15. A method for evaluating an on-chip signal having an analog voltage for a semiconductor chip, comprising the steps of:

a) applying an externally generated test signal having an analog voltage to one input of a test circuit on the chip;

b) applying the on-chip signal being evaluated to another input of the test circuit;

c) detecting by said test circuit the relative magnitude of said on-chip signal analog voltage and the analog voltage of said test signal; and d) producing an output from the test circuit that indicates the greater magnitude of the analog voltage of the on-chip signal and the analog voltage of the test signal.

16. The method of claim 15 wherein the test signal is applied in an iterative manner with a characteristic of the test signal being changed with each iteration.

17. The method of claim 16 wherein on-chip analog signal voltage level is determined by detecting said on-chip voltage exceeding said test voltage during one of said iterations.

18. The method of claim 17 wherein said on-chip signal comprises a differential signal on a pair of bit lines connected to a memory array.

19. The method of claim 18 wherein a sense amplifier is used to compare said differential signal with a differential test signal with the sense amplifier output state being determined by the relative magnitude of said differential signal and said differential test signal.

20. The method of claim 15 wherein said step of comparing said on-chip signal with said test signal is performed iteratively at different points in time to evaluate an on-chip signal waveform.

* * * * *